United States Patent
Kügler et al.

(10) Patent No.: US 6,329,077 B1
(45) Date of Patent: Dec. 11, 2001

(54) PLATE-SHAPED COMPRESSION MOLD, PROCESS FOR PRODUCING THE SAME AND PROCESS FOR MAKING LAMINATE THEREWITH

(75) Inventors: Alfred Kügler, Mürzzuschlag; Werner Josef Jerlich, Langenwang, both of (AT)

(73) Assignee: Bohler Bleche GmbH, Murzzuschlag (AT)

(*) Notice: Subject to any disclaimer, the term of this patent is extended or adjusted under 35 U.S.C. 154(b) by 0 days.

(21) Appl. No.: 09/488,928

(22) Filed: Jan. 21, 2000

(30) Foreign Application Priority Data

Jan. 21, 1999 (AT) .......................................... 82/99

(51) Int. Cl.[7] .................. B32B 15/00; B05D 5/00
(52) U.S. Cl. ..................... 428/667; 148/530; 249/78; 249/114.1; 249/187.1; 427/123; 428/679; 428/680; 428/577; 428/686; 428/687; 428/564; 428/545; 428/457; 428/926; 428/940; 156/580
(58) Field of Search ........................ 428/667, 679, 428/680, 577, 686, 687, 564, 545, 457, 926, 940; 148/530; 427/96, 123; 249/78, 114.1, 187.1; 156/580

(56) References Cited

U.S. PATENT DOCUMENTS 4,997,674 * 3/1991 Parr et al. ............................ 427/123

5,582,341   12/1996 Kanayama et al. .

FOREIGN PATENT DOCUMENTS 2444698   12/1977 (DE) .

OTHER PUBLICATIONS

JP 10273757 A (Nisshin Steel Co Ltd), (abstract), Oct. 13, 1998, in Patent Abstracts of Japan (CD–ROM vol. 1999 No. 1, Jan. 29, 1999).
JP 62–23733 A (Fujitsu Ltd), Jan. 31, 1987, Patent Abstracts of Japan vol. 11 No. 199 (M–602) (abstract).
"Dubbel's Taschenbuch für Maschinenbau", 12th Ed., Springer Verlag Berlin, p.516, reprint Dec. 1963.
K.–H. Pietsch, "Neue funktionelle Chemisch–Nickel–Überzüge" in JOT Österreich, pp. 44–47 Dec. 1997.

* cited by examiner

Primary Examiner—Robert R. Koehler
(74) Attorney, Agent, or Firm—Greenblum & Bernstein P.L.C.

(57) ABSTRACT

A plate shaped compression mold, a process for producing the same and a process for making laminate therewith. The plate-shaped compression mold for producing sheet laminate including synthetic resin with a metal coating on at least one surface thereof has a surface for contacting the metal coating of the sheet laminate, which surface has a Rockwell C hardness of higher than about 44 and a thermal coefficient of linear expansion which differs from that of the metal coating by not more than about $2.5 \times 10^{-6}$/K, thereby substantially preventing warping or wrinkling of the metal coating during the compression molding process.

47 Claims, 1 Drawing Sheet

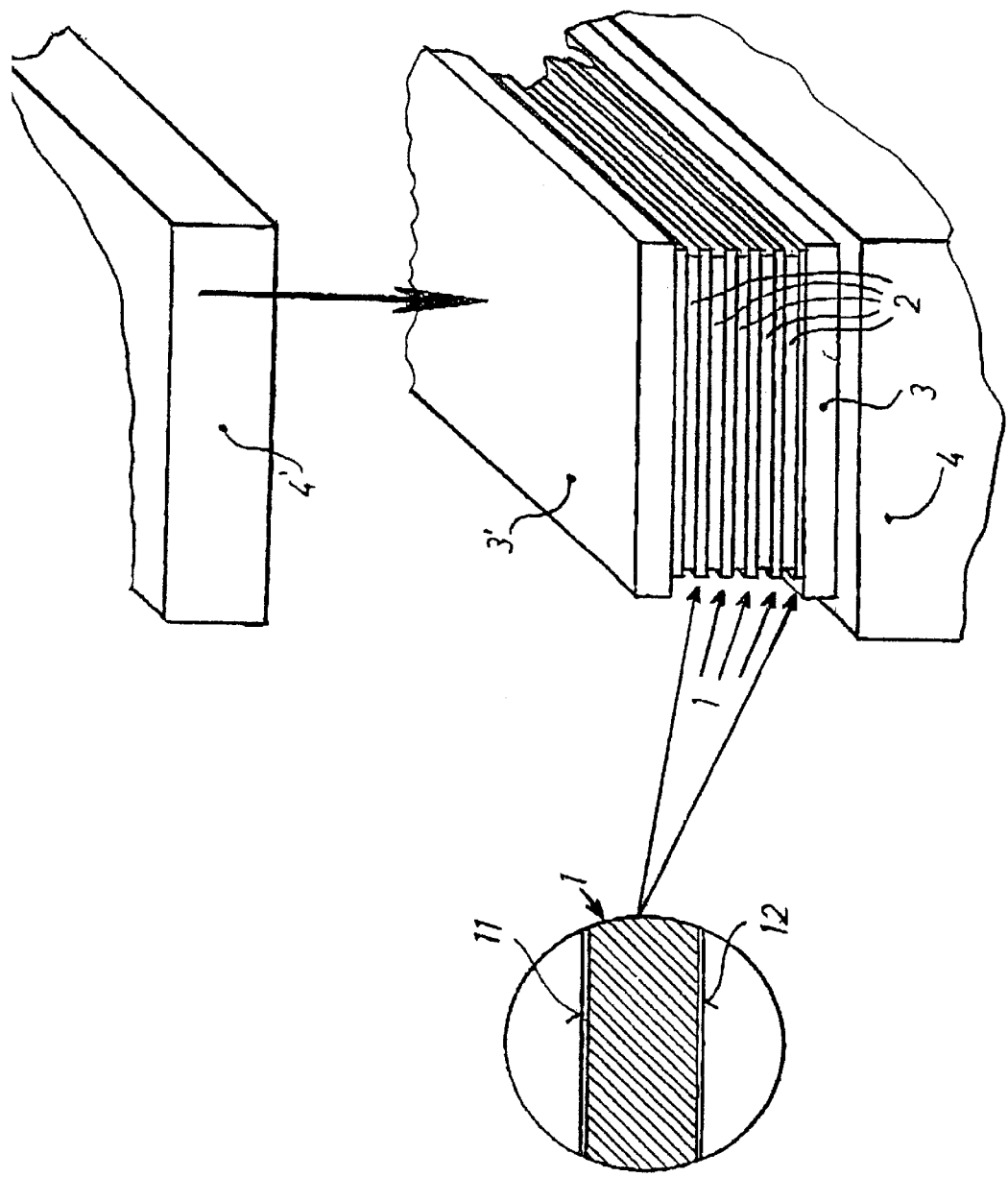
Figure

PLATE-SHAPED COMPRESSION MOLD, PROCESS FOR PRODUCING THE SAME AND PROCESS FOR MAKING LAMINATE THEREWITH

CROSS-REFERENCE TO RELATED APPLICATIONS

The present application claims priority under 35 U.S.C. § 119 of Austrian Patent Application No. 82/99, filed on Jan. 21, 1999.

BACKGROUND OF THE INVENTION

1. Field of the Invention

The present invention relates to a plate-shaped compression mold for producing sheet laminates made of synthetic resins and having a metal coating on at least one surface thereof. In addition, the invention relates to a process for producing a pressing plate of a plate-shaped compression mold, and a process for producing sheet laminates, in particular printed circuit boards with copper coatings, wherein a corresponding compression mold is employed.

2. Discussion of Background Information

Technical laminates are flat elements, produced by stacking and thermal compression molding of substrates, which are impregnated with synthetic resin, for example, phenolic resin. Paper, fiber mats, such as glass fiber mats, and the like can be used as substrates. The curing process of the synthetic resin at high temperature can take place in several steps. Particularly, partially cured or pre-cured plates are prepared, provided with coatings or the like and/or stacked, and are completely cured in plate-shaped compression molds, for example between pressing plates, under the action of compressive forces and heat, whereby so-called multilayer boards can be produced.

Printed circuit boards, which are used for producing electronic devices and similar assemblies, are synthetic resin laminated elements, which have, at least on one side, a metal coating, in particular a copper coating. These circuit boards are produced by placing copper foil, usually having a thickness of from about from 5 $\mu$m to about 35 $\mu$m, on the flat surface(s) of the pre-cured laminate, clamping the resulting structure between pressing plates with extremely high surface quality, and heating same under pressure to a temperature of between 150° C. and 450° C. such that complete curing of the synthetic resin takes place.

Pressing plates for making technical laminates generally have a surface area of as much as 3.0 m$^2$ or more and a thickness of about 0.8 mm to about 3.0 mm with the least possible variation in thickness and extremely high surface quality. Because of the chemical stress and the atmospheric attack, these pressing plates must have high corrosion resistance and a high degree of hardness as well a high wear resistance. To meet these requirements, martensitic chromium steels are usually used for pressing plates, with the plates being tempered according to special hardening processes. Precipitation hardenable iron-base alloys are also used as pressing plate materials.

A great disadvantage of these pressing plate materials is their comparatively low thermal coefficient of linear expansion of about 10.0×10$^{-6}$/K to 13.0×10$^{-6}$/K at room temperature. If, during the circuit board production process, the working surface of the pressing plate is pressed against the copper foil of the laminate and the system is brought to a curing temperature of, for example, 230° C., the copper with a thermal coefficient of linear expansion of 16.8×10$^{-6}$/K expands more than the compression surface of the mold. This difference in expansion behavior of the mold and the coating of the laminate upon heating to the curing temperature of the resin can result in warping and wrinkling of the copper foil and make such printed circuit boards unusable.

To avoid this disadvantage, it has already been attempted to make the pressing plates from a material which has a thermal coefficient of linear expansion which is at least close to that of the coating metal copper. Besides hard bronzes, austenitic steels and similar alloys, whose thermal coefficient of linear expansion is from 16×10$^{-6}$/K to 17×10$^{-6}$/K, have been used. While wrinkles and warping of the coating foil during curing of the laminate resin due to a temperature increase during molding can be avoided with these mold materials, the service life of such pressing plates is short. This disadvantage is caused by the fact that, due to the low hardness as well as the flow characteristics under local pressure stress of these materials and because of their low wear resistance, dents caused, for example, by foreign bodies, such as grains of dust and the like and/or borders or edges of the laminate, may be formed in the working surface. During compression of the next circuit board, these dents create a bump on the metal coating which is disadvantageous since upon etching of the conductors the Ohmic resistance in the corresponding layer area will differ from that in the rest of the layer.

SUMMARY OF THE INVENTION

The present invention eliminates the disadvantages of the known pressing plate materials and provides a compression mold of the type mentioned above with which, along with improved quality of the laminates, in particular of printed circuit boards, a long service life can be obtained. The present invention also provides a process with which an improved compression mold for the processing of technical laminates, in particular of circuit boards, can be produced. Additionally, the invention provides a process for the production of sheet laminates wherein an improved compression mold is utilized, as well as sheet laminates produced by such a process.

The present invention relates to a plate-shaped compression mold for producing sheet laminates which include synthetic resin and a metal coating on at least one side or surface thereof. The surface of the compression mold that is adapted to contact the metal coating of the sheet laminate has a Rockwell C hardness (HRC) of higher than about 44, preferably higher than 45, and most preferred higher than 46, and a thermal coefficient of linear expansion which differs from that of the metal coating by not more than about 2.5×10$^{-6}$/K, preferably not more than about 2.0×10$^{-6}$/K, and most preferred not more than about 1.4×10$^{-6}$/K.

One of the advantages of the compression mold of the present invention is that in this system the shearing stress caused by a temperature change and the stress in the direction of the active compression surface can be kept low so that no disadvantageous warping or wrinkling of the metal coating occurs. The stipulated hardness of the mold surface that comes into contact with the metal coating prevents the formation of dents caused by foreign bodies, such as grains of dust, burrs, and the like and/or by borders or edges of the laminate, in the mold surface.

The plate-shaped compression mold according to the present invention will usually have a (preferably heatable) pressing plate as the surface adapted to contact the metal coating of the sheet laminate.

Both for an improvement of corrosion resistance and for reduction of wear and an adhesive tendency of the working surface of the mold, it is particularly advantageous for it to have a hard coating.

With a view to improved mold service life and to high product quality it is highly advantageous if a pressing plate that is to come into contact with the metal coating of the laminate includes corrosion resistant metal or alloy with face-centered cubic atomic structure, especially if technical laminates with copper coatings or copper layers, for example, printed circuit boards, are to be produced. Copper has a face-centered cubic atomic structure which may be the reason for an advantageously similar thermal coefficient of linear expansion.

If, as has been found, the compression mold or the pressing plate, respectively includes corrosion-resistant austenitic steel and has on its working surface a (well known) microcracked hot chromium/hard chromium layer with a Vickers hardness, determined with a load of 0.1 kg ($HV_{0.1}$), of greater than 900, very high mold service lives and better product quality can be achieved, even if thin copper foils in the range of about 5 $\mu$m thickness are used as metal coatings of the laminates. Preferably, the $HV_{0.1}$ is greater than 1000 and most preferred greater than 1100. As regards the methods for determining HRC (DIN 50103) and $HV_{0.1}$ (DIN 50133), reference may be made, for example, to "Dubbels Taschenbuch fur Maschinenbau", 12. Edition, reprint 1963, Springer Verlag Berlin, p. 516.

Although, in comparison with austenitic steel, chromium has an approximately 2.5 times lower thermal coefficient of linear expansion of $6.6 \times 10^{-6}$/K, using hot chromium plating, a thin hard chromium layer adhering to the base plate, which follows the thermal linear changes of the base material can be applied thereon and finished. The ductility of the chromium layer despite its high degree of hardness is probably based on its microcracked structure. The thickness of the hot chromium/hard chromium layer usually ranges from about 5 $\mu$m to about 55 $\mu$m, particularly from about 5 $\mu$m to about 20 $\mu$m and most preferred from about 8 $\mu$m to about 13 $\mu$m.

Alternatively, the hard coating on the working surface can be formed by an (also well-known) high phosphorus chemical nickel coating with a hardness $HV_{0.1}$ greater than 900, preferably greater than 1000 and most preferred greater than 1100, and a thickness which usually ranges from about 5 $\mu$m to about 55 $\mu$m, particularly from about 5 $\mu$m to about 20 $\mu$m and most preferred from about 8 $\mu$m to about 13 $\mu$m. The autocatalytic nickel phosphorus deposit is transformed into a structure with high hardness by tempering and has advantageously improved corrosion resistance. For a discussion of corresponding hard coatings reference may be made to K. H. Pietsch, "Neue funktionelle Chemisch-Nickel-Überzüge" in JOT Österreich, December 1997, pp. 44–47.

To obtain a further increase in wear resistance of the working surface, the hard coating on the working surface may advantageously be designed as dispersion layer. Dispersion layers contain particles of hard materials, for example, of diamond or silicon carbide, dispersed in the hard coating.

In addition to austenitic steel, examples of other materials which are suitable for the purposes of the present invention include CrNi steel and precipitation hardenable austenitic Ni-based alloys.

The present invention also relates to a process for producing a pressing plate of a plate-shaped compression mold for the processing of sheet laminates. The process includes the provision of a base plate including metal or alloy of face centered cubic atomic structure having a thickness variation of not more than about 0.1 mm. Preferably said thickness variation is not higher than 0.08 mm and particularly preferred not higher than 0.06 mm. On at least one surface of the base plate a coating having a Rockwell C hardness (HRC) of higher than about 44, preferably higher than about 45 and most preferred higher than about 46, is applied. The thickness of the coating ranges from about 5 $\mu$m to about 55 $\mu$m, particularly from about 5 $\mu$m to about 20 $\mu$m and most preferred from about 8 $\mu$m to about 13 $\mu$m. The advantages of the above process include that, on the one hand, base plates with extremely high surface quality can be kept in stock and, on the other hand, a desired or required hard layer can at any time be applied quickly on the base plate, which advantageously results in economical short preparation times for finished compression molds. Particularly good use characteristics of the mold can be obtained in continuous operation if a hot chromium/hard chromium coating with microcracks or a high-phosphorus chemical nickel coating as explained above are applied on the base plate. A preferred base plate has already been described above in connection with the plate-shaped compression mold provided by the present invention.

The present invention also relates to a process for producing a sheet laminate including synthetic resin with a metallic coating on at least one surface thereof. The process includes the provision of a sheet substrate including synthetic resin, placing a metal foil on at least one surface of the substrate, thereby providing a precursor of the sheet laminate, and placing the precursor in a plate-shaped compression mold and applying pressure thereon, preferably under heating, thereby forming the sheet laminate. A surface of the plate-shaped compression mold that is adapted to contact the metal foil has a Rockwell C hardness of higher than about 44, preferably higher than about 45 and most preferred higher than about 46, and a thermal coefficient of linear expansion which differs from that of the metal of the metal foil by not more than about $2.5 \times 10^{-6}$/K, preferably not more than about $2.0 \times 10^{-6}$/K, and most preferred not more than about $1.4 \times 10^{-6}$/K.

Usually the plate-shaped compression mold will include a (preferably heatable) pressing plate as surface adapted to contact the metal foil. The base plate is advantageously provided with a hard surface coating having a Rockwell C hardness of higher than about 44. It is preferred for the material of the base plate to include metal or alloy having a face-centered cubic atomic structure, particularly austenitic steel.

The hard surface coating may be a microcracked hot chromium/hard chromium coating or a high phosphorus chemical nickel layer, particularly one having a Vickers hardness, determined with a load of 0.1 kg, of greater than about 900.

Base plates and hard coatings, including preferred embodiments thereof, have already been described above.

Preferably the thickness of the metal foil placed on the sheet is about 5 $\mu$m to about 35 $\mu$m, particularly 5 $\mu$m to about 20 $\mu$m. Moreover, particularly if a circuit board is to be produced by the above process the metal foil will be a copper foil or at least contain copper (e.g., a copper alloy). However, other metals and alloys are also envisaged, especially silver and gold and alloys thereof. In the case of a circuit board the synthetic resin will be one that is conventionally used for circuit board, e.g. a phenolic resin.

The synthetic resin may be fiber-reinforced, for example, with glass fibers. It also may contain conventional inorganic and organic fillers.

The temperature at which the compression mold is to be held during the compression process is determined by the nature of the synthetic resin to be hardened, but will usually range from about 150 to 450° C. In the case of a phenolic resin temperatures in the range of from about 150 to 250° C., particularly about 170 to 230° C., are usually appropriate.

Other exemplary embodiments and advantages of the present invention may be ascertained by reviewing the present disclosure.

BRIEF DESCRIPTION OF THE DRAWINGS

In the drawings, the only FIGURE shows an embodiment of a plate-shaped compression mold of the invention with a sheet laminate between the pressing plates of the mold.

DETAILED DESCRIPTION OF THE PRESENT INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

The FIGURE illustrates an embodiment of a compression mold according to the present invention. In particular, the compression mold comprises a bottom pressing plate 3 and a top pressing plate 3', as well as lower and upper press members 4 and 4' for pressing the pressing plates 3 and 3' against the (multilayer) laminate 1. The pressing plates 3' and 3 are each provided with a hard surface coating 11 and 12, respectively, on the surfaces thereof which are to come into contact with the laminate 1. Laminate 1 comprises layers 2 of metal foils and synthetic resin.

The invention is explained in the following by way of example using test results. Pressing plates made of a precipitation hardening stainless chromium steel DIN material No. X5CrNiCuNb 17 4 with a thickness of 2.0 mm, a hardness of 49 HRC and special surface quality were prepared and used in circuit board production. Copper foils with a thickness of 5 $\mu$m+/−10% were applied on both sides of plate-shaped substrates comprising phenolic resin, pressed onto the substrates by the pressing plates, and the system was heated to 195° C. to cure the synthetic resin. After the printed circuit boards were unclamped, they were tested and it was determined that, while the copper coating did demonstrate good adhesion on the substrate, it had a wavy shape with wrinkles and overlays. Measurements revealed that the DIN material of the above-described pressing plates had a thermal coefficient of linear expansion of $10.9 \times 10^{-6}$/K.

Pressing plates with a thickness of 2.0 mm were also produced from austenitic CrNi steel as material for the base plates. The base plates were provided, in one experiment, with a hot chromium/hard chromium coating with a thickness of 14 $\mu$m and, in another experiment, with a high phosphorus chemical nickel coating with a thickness of 46 $\mu$m. After finishing or tempering the coating, these pressing plates were used in circuit board production. No wrinkles or wave formations at all of the 5 $\mu$m thick copper coating could be detected on the printed circuit board; even a high-quantity test in series production yielded a low adhesive tendency and significantly improved quality. Measurements of the thermal coefficient of linear expansion of the pressing plates yielded values of $16.6 \times 10^{-6}$/K It is noted that the foregoing examples have been provided merely for the purpose of explanation and are in no way to be construed as limiting of the present invention. While the present invention has been described with reference to an exemplary embodiment, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed is:

1. A plate-shaped compression mold for producing sheet laminates including synthetic resin with a metal coating on at least one surface thereof, the mold comprising a surface for contacting the metal coating of the sheet laminate, said surface having a Rockwell C hardness of higher than about 44 and a thermal coefficient of linear expansion which differs from that of the metal coating by not more than about $2.5 \times 10^{-6}$/K.

2. The plate-shaped compression mold of claim 1, wherein the Rockwell C hardness is higher than about 46.

3. The plate-shaped compression mold of claim 1, wherein the difference between the thermal coefficients of linear expansion is not higher than about $1.4 \times 10^{-6}$/K.

4. The plate-shaped compression mold of claim 1, wherein the surface for contacting the metal coating of the sheet laminate comprises a pressing plate.

5. The plate-shaped compression mold of claim 4, wherein the pressing plate is heatable.

6. The plate-shaped compression mold of claim 4, wherein the pressing plate comprises a base plate provided with a hard surface coating having a Rockwell C hardness of higher than about 44.

7. The plate-shaped compression mold of claim 6, wherein the base plate comprises metal or alloy having a face-centered cubic atomic structure.

8. The plate-shaped compression mold of claim 7, wherein the base plate comprises austenitic steel.

9. The plate-shaped compression mold of claim 6, wherein the surface coating comprises a microcracked hot chromium/hard chromium coating.

10. The plate-shaped compression mold of claim 9, wherein the microcracked hot chromium/hard chromium coating has a Vickers hardness, determined with a load of 0.1 kg, of greater than about 900.

11. The plate-shaped compression mold of claim 6, wherein the surface coating comprises a high phosphorus chemical nickel layer.

12. The plate-shaped compression mold of claim 11, wherein the high phosphorus chemical nickel layer has a Vickers hardness, determined with a load of 0.1 kg, of greater than about 900.

13. The plate-shaped compression mold of claim 6, wherein the maximum thickness variation of the base plate is not more than about 0.1 mm.

14. The plate-shaped compression mold of claim 6, wherein the thickness of the hard surface coating ranges from about 5 $\mu$m to about 55 $\mu$m.

15. The plate-shaped compression mold of claim 6, wherein the hard surface coating comprises a dispersion layer of a matrix with hard particles dispersed therein.

16. A process for producing a pressing plate of a plate-shaped compression mold for the processing of sheet laminates, comprising:
   providing a base plate having a thickness variation of not more than about 0.1 mm and including metal or alloy having a face-centered cubic atomic structure; and
   applying on at least one surface of the base plate a coating having a Rockwell C hardness of higher than about 44 and a thickness between about 5 $\mu$m and about 55 $\mu$m.

17. The process of claim 16, wherein the material of the base plate is corrosion resistant.

18. The process of claim 16, wherein the thickness variation of the base plate is not more than about 0.06 mm.

19. The process of claim 16, wherein the base plate comprises austenitic steel.

20. The process of claim 16, wherein the coating comprises a microcracked hot chromium/hard chromium coating.

21. The process of claim 20, wherein the microcracked hot chromium/hard chromium coating has a Vickers hardness, determined with a load of 0.1 kg, of greater than about 900.

22. The process of claim 16, wherein the coating comprises a high phosphorus chemical nickel layer.

23. The process of claim 22, wherein the high phosphorus chemical nickel layer has a Vickers hardness, determined with a load of 0.1 kg, of greater than about 900.

24. The process of claim 22, wherein the high phosphorus chemical nickel layer has a thickness between about 5 $\mu$m and about 20 $\mu$m.

25. A process for producing a sheet laminate including synthetic-resin with a metallic coating on at least one surface thereof, the process comprising
   (a) providing a sheet substrate comprising synthetic resin;
   (b) placing a metal foil on at least one surface of the substrate, thereby providing a precursor of the sheet laminate;
   (c) placing the precursor in a plate-shaped compression mold and applying pressure thereon, thereby forming the sheet laminate;
      wherein the plate-shaped compression mold has a surface for contacting the metal foil, said surface having a Rockwell C hardness of higher than about 44 and a thermal coefficient of linear expansion which differs from that of the metal foil by not more than about $2.5 \times 10^{-6}$/K.

26. The process of claim 25, wherein the Rockwell C hardness of the surface for contacting the metal foil is higher than about 46.

27. The process of claim 25, wherein the difference between the thermal coefficients of linear expansion is not higher than about $1.4 \times 10^{-6}$/K.

28. The process of claim 25, wherein the surface for contacting the metal foil comprises a pressing plate.

29. The process of claim 28, wherein the pressing plate is heatable.

30. The process of claim 28, wherein the pressing plate comprises a base plate provided with a hard surface coating having a Rockwell C hardness of higher than about 44.

31. The process of claim 30, wherein the base plate comprises metal or alloy having a face-centered cubic atomic structure.

32. The process of claim 30, wherein the surface coating comprises a microcracked hot chromium/hard chromium coating.

33. The process of claim 32, wherein the microcracked hot chromium/hard chromium coating has a Vickers hardness, determined with a load of 0.1 kg, of greater than about 900.

34. The process of claim 30, wherein the surface coating comprises a high phosphorus chemical nickel layer.

35. The process of claim 34, wherein the high phosphorus chemical nickel layer has a Vickers hardness, determined with a load of 0.1 kg, of greater than about 900.

36. The process of claim 31, wherein the base plate comprises austenitic steel.

37. The process of claim 30, wherein the maximum thickness variation of the base plate is not more than about 0.1 mm.

38. The process of claim 30, wherein the thickness of the hard surface coating ranges from about 5 $\mu$m to about 55 $\mu$m.

39. The process of claim 30, wherein the hard surface coating comprises a dispersion layer of a matrix with hard particles dispersed therein.

40. The process of claim 25, wherein the metal foil comprises copper.

41. The process of claim 25, wherein the metal foil is between about 5 $\mu$m and about 35 $\mu$m thick.

42. The process of claim 25, wherein the synthetic resin comprises phenolic resin.

43. The process of claim 25, wherein the synthetic resin is fiber-reinforced.

44. The process of claim 25, wherein heat is applied to cure the synthetic resin of the precursor.

45. The process of claim 44 wherein the temperature during heating is about 150 to 450° C.

46. The process of claim 25 wherein the sheet laminate is a circuit board.

47. A sheet laminate including synthetic resin with a metal coating on at least one surface thereof, said sheet laminate being produced by a process comprising
   (a) providing a sheet substrate comprising synthetic resin;
   (b) placing a metal foil on at least one surface of the substrate, thereby providing a precursor of the sheet laminate;
   (c) placing the precursor in a plate-shaped compression mold and applying pressure thereon, thereby forming the sheet laminate;
      wherein the plate-shaped compression mold has a surface for contacting the metal foil, said surface having a Rockwell C hardness of higher than about 44 and a thermal coefficient of linear expansion which differs from that of the metal foil by not more than about $2.5 \times 10^{-6}$/K.

* * * * *